United States Patent [19]
Fong

[11] Patent Number: 6,147,559
[45] Date of Patent: *Nov. 14, 2000

[54] NOISE FIGURE AND LINEARITY IMPROVEMENT TECHNIQUE USING SHUNT FEEDBACK

[75] Inventor: Keng Leong Fong, Sunnyvale, Calif.

[73] Assignee: Philips Electronics North America Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/126,242

[22] Filed: Jul. 30, 1998

[51] Int. Cl.$^7$ ........................................................ H03F 3/68
[52] U.S. Cl. ............................................ 330/311; 330/294
[58] Field of Search ........................... 330/310, 311, 330/292, 98, 99, 294

[56] References Cited

U.S. PATENT DOCUMENTS

| | | | |
|---|---|---|---|
| 4,940,949 | 7/1990 | Landi | 330/262 |
| 5,389,891 | 2/1995 | Philippe | 330/253 |
| 5,530,405 | 6/1996 | Rydel | 330/278 |

FOREIGN PATENT DOCUMENTS

| | | | |
|---|---|---|---|
| 0681367A1 | 8/1995 | European Pat. Off. | H03F 3/26 |
| 62-292007A | 6/1986 | Japan | H03F 1/34 |

OTHER PUBLICATIONS

"Analysis of the Transistor Cascode Configuration", J.R. James, Electronic Engineering, Jan. 1960, pp. 44–48.

*Primary Examiner*—Robert Pascal
*Assistant Examiner*—Henry Choe
*Attorney, Agent, or Firm*—Brian J. Wieghaus

[57] ABSTRACT

A shunt-feedback technique is provided for improving noise figure and linearity of electronic circuits, such as amplifiers and mixers. An input common-emitter transconductance stage of an electronic circuit has a transistor, and a degeneration impedance provided between the emitter of the transistor and a ground terminal. A feedback capacitor is connected between the collector and the base of the transistor. A feedback resistor is coupled between the collector of the transconductance stage transistor and the emitter of a transistor in the next stage of the electronic circuit. The feedback capacitor and the feedback resistor form a shunt-feedback network.

15 Claims, 1 Drawing Sheet

NOISE FIGURE AND LINEARITY IMPROVEMENT TECHNIQUE USING SHUNT FEEDBACK

BACKGROUND OF THE INVENTION

1. Field of the Invention

The present invention relates to electric circuits, and more particularly, to a shunt-feedback technique for improving noise figure and linearity in electronic circuits such as amplifiers and mixers.

2. Background Art

Noise figure and linearity are among key characteristics of amplifiers and mixers. Noise figure represents the degradation of signal-to-noise ratio, or, SNR (increase in noise), caused by a circuit. (SNR is the ratio of the power of a desired signal to the power of noise signals.) Hence, the noise figure corresponds to the difference between the SNR at the input of the circuit and the SNR at the output of the circuit. Noise figure is especially important for the first stages of an amplifier chain because noise produced in, or passed through, the first stage will be amplified by subsequent stages.

The linearity of a circuit may be defined by various parameters. For example, the input third-order intercept point represents third-order non-linearity in the transfer function of a circuit. Due to the third-order non-linearity, two undesired signals in adjacent channels generate output third-order intermodulation products (IM3) which can corrupt the desired signal at the output. The power of the desired signal at the output of a linear circuit increases linearly with the input power of the circuit. However, the power of the output IM3 increases with the cube of the input power. The input third-order intercept point is the input power level, at which the power of the desired signal at the output of a circuit is equal to the power of the output IM3.

FIG. 1 shows a typical low-noise amplifier (LNA) 10 for amplifying input signals, such as radio-frequency signals propagating through receiving circuitry of a cellular telephone. A signal input RFin is provided for receiving an input signal from a source, such as a tuner or the previous amplifier stage. The input signal is supplied to the base of an NPN junction transistor Q1. A degeneration impedance Ze is coupled between the emitter of the transistor Q1 and a ground terminal. The transistor Q1 and the impedance Ze function as a common-emitter transconductance stage.

An NPN junction transistor Q2 is connected to the transistor Q1 in a cascode configuration. The emitter of the transistor Q2 is connected to the collector of the transistor Q1. The base of the transistor Q2 is supplied with bias voltage from a bias input. A resistor R1 and an inductor L1 are coupled between the collector of the transistor Q2 and a source of collector voltage Vcc. A capacitor C1 is arranged between the collector of the transistor Q2 and an output RFout of the low noise amplifier 10.

The resistor R1 is an output-matching resistor that functions to match the output impedance of the low noise amplifier 10 with the impedance of a load coupled to the output RFout. The inductor L1 and capacitor C1 form an impedance transformation network that transforms the output impedance defined by the resistor R1 to match the impedance of the load. The inductor L1 also serves as a pull-up inductor that increases the allowable voltage at the collector of the transistor Q2.

In some applications, high linearity is as important as low noise figure. In conventional amplifiers, linearity is improved by increasing the impedence value of the degeneration impedance Ze. However, a high degeneration impedance Ze results in a high impedance at the amplifier input RFin. To match the high input impedance of the amplifier 10 with the impedance of the source, an impedance matching network is required between the input RFin and the source.

The sensitivity of the impedance matching network to component variations depends on the impedance mismatch between the amplifier input and the source. The larger the impedance mismatch is, the more sensitive the matching circuit becomes.

Further, an increase in impedance at the base of the transistor Q1 causes an increase in base shot noise contribution from the transistor Q1. (Shot noise is associated with direct-current flow in a pn junction. This current is composed of holes and electrons, which have sufficient energy to overcome the potential barrier of the junction. As the passage of each carrier through the junction is a random event, it causes random fluctuations of the current called the shot noise. Base shot noise is the shot noise of a bipolar transistor caused by the base current.) As a result, the noise figure of the amplifier 10 increases. An increase in the degeneration impedance thus cannot improve the linearity of the amplifier 10 without degrading other performance parameters of the amplifier, such as noise figure.

It would be desirable to create a new technique that improves not only the linearity of an electronic circuit but also its noise figure.

SUMMARY OF THE INVENTION

Various advantages of the invention are achieved at least in part by providing an electronic circuit, such as an amplifier or a mixer, which comprises a transconductance stage coupled to an input of the electronic circuit for transforming power of an input signal into current. A second stage is coupled between the transconductance stage and an output of the electronic circuit. A shunt-feedback network is arranged so as to establish a signal flow path between the input and a point between the transconductance stage and the second stage to improve linearity and noise figure of the electronic circuit.

In accordance with a preferred embodiment of the present invention, the transconductance stage may comprise a first transistor having a base coupled to the input. A degeneration impedance may be provided between an emitter of the first transistor and a ground terminal.

The shunt-feedback network may comprise a feedback capacitor coupled to the input, and a feedback resistor between the transconductance stage and the second stage.

The second stage may comprise a second transistor arranged in a cascode configuration to isolate the output from the transconductance stage. The second transistor may have an emitter coupled to the feedback resistor, a base supplied with a bias voltage and a collector coupled to the output.

Alternatively, the second stage may comprise at least one switching element coupled between the feedback resistor and the output. The switching element may be controlled by a signal from a local oscillator to produce an output signal having a frequency different from the frequency of the input signal. For example, the switching element may comprise a switching transistor having an emitter coupled to the feedback resistor, a base supplied with the signal from the local oscillator, and a collector coupled to the output.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DETAILED DESCRIPTION OF THE INVENTION

Figure 2:
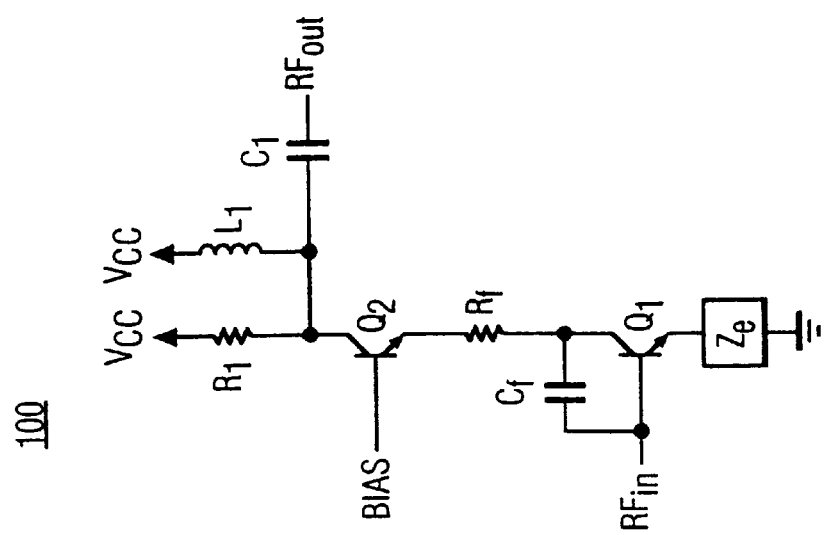
FIG. 2 shows a low noise amplifier implementing principles of the present invention.
Figure 1:
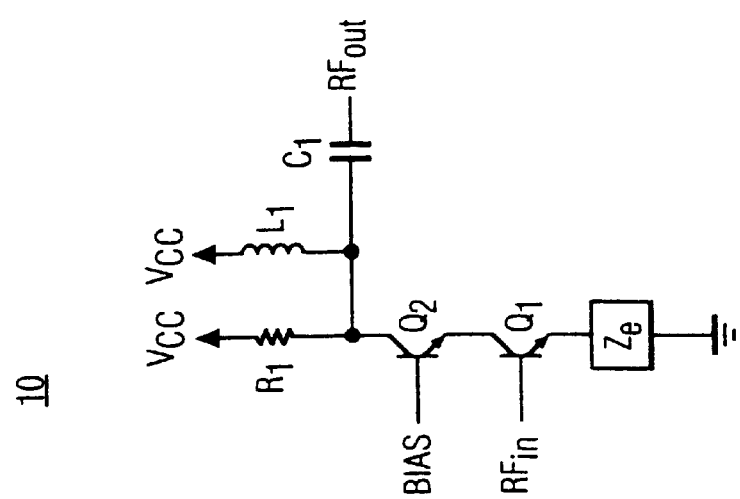
FIG. 1 illustrates a conventional low noise amplifier.

Although the invention has general applicability in the field of electronic circuits, the best mode for practicing the invention is based in part on the realization of low noise amplifiers and mixers, using shunt feedback. Referring to FIG. 2, a low noise amplifier 100 of the present invention comprises a signal input RFin for supplying signals, for example, radio-frequency signals propagating through receiving circuitry of a cellular telephone, from a source, such as the previous stage of the receiving circuitry. For example, the amplifier 100 may operate at 0.9 GHz.

The input signal is supplied to the base of an NPN junction transistor Q1. A degeneration impedance Ze may be coupled between the emitter of the transistor Q1 and a ground terminal. For example, an inductor having an inductance selected in the range between 1nH and 3nH may be used as the degeneration impedance Ze. The transistor Q1 and the impedance Ze function as a common-emitter transconductance stage to transform the power of the input signal into current produced on the collector of the transistor Q1. The impedance Ze is preferred; however, the emitter of the transistor Q1 may be connected directly to the ground.

An NPN junction transistor Q2 is connected to the transistor Q1 in a cascode configuration to isolate an output RFout of the amplifier 100 from the transconductance stage. The base of the transistor Q2 is supplied with bias voltage, for example, about 2 V from a bias input Bias. A resistor R1 and an inductor L1 are coupled between the collector of the transistor Q2 and a source of collector voltage Vcc. For example, the collector voltage may be equal to about 3V.

A capacitor C1 is arranged between the collector of the transistor Q2 and the output RFout of the low noise amplifier 100. For example, for an operating frequency of 0.9 GHz, the capacitance of the capacitor C1 may be selected to be 1 pF, the resistance of the resistor R1 may be 200 Ohm, and the inductance of the inductor L1 may be selected to be 5 nH.

The resistor R1 functions as an output-matching resistor that matches the output impedance of the low noise amplifier 100 with the impedance of a load coupled to the output RFout. The inductor L1 and capacitor C1 form an output impedance transformation network to match the output impedance of the amplifier 100 with the impedance of the load. The inductor L1 also serves as a pull-up inductor that increases the allowable voltage at the collector of the transistor Q2. Although the present invention is disclosed with the example of bipolar transistors, one skilled in the art will realize that field effect transistors may be used as the transistors Q1 and Q2.

To improve the linearity of the low noise amplifier 100, a shunt-feedback network is arranged to provide the amplifier 100 with negative feedback. The shunt-feedback network comprises a feedback resistor Rf coupled between the emitter of the transistor Q2 and the collector of the transistor Q1, and a feedback capacitor Cf coupled between the feedback resistor Rf and the base of the transistor Q1. The feedback capacitor Cf may be the internal capacitance of transistor Q1.

Thus, the amplifier 100 has a series-feedback circuit provided by the degeneration impedance Ze, and an additional shunt-feedback circuit provided by the feedback resistor Rf and feedback capacitor Cf. As will be appreciated by those skilled in the art, shunt feedback, implemented as described, allows the common-emitter transconductance stage to be linearized. This advantageous effect is produced by negative current feedback between the emitter of the transistor Q2 and the input of the amplifier 100, tending to offset nonlinearities in amplifier gain response. This negative feedback concomitantly reduces signal distortion.

Further, the feedback strategy of the present invention stabilizes the gain of the amplifier 100 when parameters of the transistors Q1 and Q2 fluctuate, and allows the designer to modify the input and output impedances of the amplifier 100 in a desirable fashion. In particular, shunt feedback, implemented as described, not only allows the input impedance of the amplifier to be reduced, but moreover increases the bandwidth of the amplifier 100. Feedback theory, and details of shunt feedback circuits are provided in Analysis and Design of Analog Integrated Circuit, by P. R. Gray and R.G. Meyer, published by John Wiley & Sons, Inc. (3rd edition, 1993), to which reference is made to enable further appreciation of the advantageous effect provided by the novel feedback presented in this invention.

Thus, shunt feedback in accordance with the present invention improves the linearity of the amplifier 100, and indeed, in accordance with simulation results, the input third-order intercept point of the amplifier 10 without shunt feedback was measured to be 0 dBm, whereas the input third-order intercept point of the amplifier 100 having shunt feedback in accordance with the present invention was found to be 3 dBm.

As discussed above, improvement of the linearity by increasing only the degeneration impedance value would result in an increase in the input impedance of the amplifier. By contrast, the shunt feedback provided by the feedback resistor Rf and feedback capacitor Cf reduces the impedance at the base of the transistor Q1. Therefore, base shot noise contribution from the transistor Q1 is reduced, reducing, concomitantly, the noise figure of the amplifier 100. Simulation results indicate that the noise figure of the amplifier 10 without shunt feedback is equal to 1.7 dB, whereas the noise figure of the amplifier 100 having shunt feedback in accordance with the present invention is equal to 1.5 dB.

Values of the feedback resistor Rf and feedback capacitor Cf may be selected so as to match the input impedance of the amplifier 100 with the impedance of the source. Thus, no additional input-matching network is required. For example, for operating frequency 0.9 GHz, the resistance of the feedback resistor Rf may be selected equal to 20 Ohm, and the capacitance of the feedback capacitor Cf may be equal to 200 fF.

The reverse isolation of a circuit is the isolation of the input of the circuit from a signal at the output of the circuit.

Traditional feedback loops in amplifiers establish a connection between the input of an amplifier and its output, and hence reduce reverse isolation of the amplifier. By contrast, the shunt-feedback network provided by the resistor Rf and capacitor Cf connects the RFin input of the amplifier 100 to the emitter of the transistor Q2. Therefore, the shunt-feedback technique of the present invention does not degrade the reverse isolation of the amplifier 100.

Figure 3:
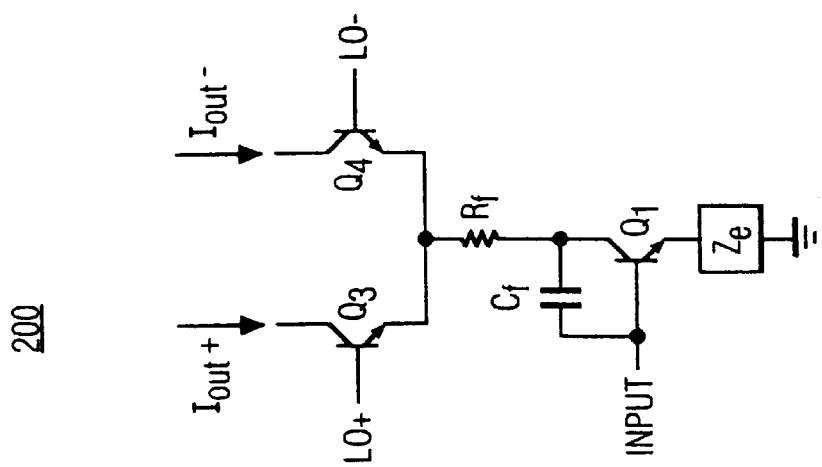
FIG. 3 illustrates a mixer circuit implementation embodying the present invention.

One skilled in the art will realize that the shunt-feedback technique of the present invention may be applied not only to low noise amplifiers, but also to other types of amplifiers and to mixers. For example, FIG. 3 shows a mixer circuit 200 using shunt feedback, in accordance with the invention, to improve linearity. The mixer circuit 200 may be used to combine an incoming radio-frequency signal with a signal of a local oscillator to produce a signal having a frequency different from the frequency of the incoming signal. Elements of the mixer circuit 200 similar to those depicted in FIG. 2 bear like reference numbers.

The mixer circuit 200 comprises a common-emitter transconductance stage formed by an NPN junction transistor Q1 and, optimally, a degeneration impedance Ze connected between the emitter of the transistor Q1 and a ground terminal. An input radio-frequency signal is supplied to the base of the transistor Q1.

A feedback capacitor Cf is connected between the collector and the base of the transistor Q1. A feedback resistor Rf is coupled between the collector of the transistor Q1 and emitters of NPN junction transistors Q3 and Q4 operating in a switching mode.

The transistors Q3 and Q4 form a switching pair driven by differential signals LO+ and LO− supplied from a local radio-frequency oscillator to bases of the transistors Q3 and Q4, respectively. The switching pair Q3 and Q4 performs a mixing operation to convert the input signal into output signals Iout+ and Iout− produced at collectors of the transistors Q3 and Q4, respectively. The frequency of the output signal differs from the frequency of the input signal. The shuntfeedback network formed by the feedback resistor Rf and feedback capacitor Cf is used to linearize the transconductance stage. This advantageous effect is produced by negative feedback between the emitters of the transistors Q3 and Q4 and the input of the mixer 200. As discussed above in connection with the amplifier 100, this negative feedback improves the linearity of the mixer circuit 200.

As the shunt-feedback network reduces the impedance at the base of the transistor Q1, the base shot noise contribution from the transistor Q1 is reduced. Therefore, the noise figure of the mixer circuit 200 is reduced. Although the present invention is disclosed with the example of bipolar transistors in the mixer circuit 200, one skilled in the art will realize that field effect transistors may be used as the transistors Q1, Q3 and Q4.

In this disclosure, there are shown and described only the preferred embodiments of the invention, but it is to be understood that the invention is capable of changes and modifications within the scope of the inventive concept as expressed herein.

What is claimed is:

1. An amplifier comprising:
    an input terminal for receiving an input signal to be amplified,
    a transconductance stage coupled to said input terminal for transforming power of the input signal into current,
    a cascode stage coupled to said transconductance stage to isolate an output terminal of said amplifier from said transconductance stage, and
    a frequency dependent shunt-feedback network comprising (i) feedback resistive device coupled between the transconductance stage and said cascode stare and (ii) only a feedback capacitance device coupled between said input and a node between said transconductance stage and said cascode stage, the frequency dependent shunt feedback circuit biasing the transconductance stage in dependence on the frequency of the input signal, to thereby improve noise figure of said amplifier; and a degeneration inductive impedance connected between an emitter of said transconductance stage and a ground terminal.

2. The electronic circuit of claim 1, wherein said cascode stage comprises at least one switching element coupled between said feedback resistive device and said output terminal.

3. The electronic circuit of claim 2, wherein said switching element is controlled by a signal from a local oscillator to produce an output signal having frequency different from frequency of said input signal.

4. The electronic circuit of claim 3, wherein said switching element comprises a switching transistor having an emitter coupled to said feedback resistive device, a base supplied with said signal from the local oscillator, and a collector coupled to said output terminal.

5. The amplifier of claim 1, wherein said transconductance stage comprises a first transistor having a base connected to said input terminal.

6. The amplifier of claim 5, wherein said transconductance stage further comprises a degeneration inductive impedance connected between an emitter of said first transistor and a ground terminal.

7. The amplifier of claim 6, wherein said cascode stage comprises a second transistor having an emitter coupled to said resistive device, a base supplied with bias voltage, and a collector coupled to said output terminal.

8. An electronic circuit comprising:
    an input terminal for receiving a first signal having first frequency,
    a transconductance stage for transforming power of said first signal to current,
    a switching stage controlled by a second signal having second frequency for producing an output signal having output frequency different from said first frequency, and
    a shunt-feedback network coupled between said input terminal and an input of said switching stage for improving linearity and noise figure of said mixer circuit.

9. The electronic circuit of claim 8, wherein said shunt-feedback network comprises a feedback capacitor coupled to said input terminal, and a feedback resistor between said transconductance stage and said switching stage.

10. The electronic circuit of claim 9, wherein said switching stage comprises a pair of switching transistors having emitters coupled to said feedback resistor, and bases supplied with said second signal.

11. An electronic circuit, comprising:
    an input for receiving an input signal, and an output;
    a transconductance stage coupled to said input for transforming power of the input signal into current;
    a second stage coupled between said transconductance stage and said output; and
    a frequency dependent shunt feedback circuit comprising (i) a feedback resistive device coupled between the transconductance stage and said second stage and (ii)

only a feedback capacitance device coupled between said input and a node between said transconductance stage and said second stage, the frequency dependent shunt feedback circuit biasing the transconductance stage as a function of frequency of the input signal, to improve the noise figure of the electronic circuit; and a degeneration inductive impedance connected between an emitter of said transconductance stage and a ground terminal.

12. The electronic circuit of claim 11, wherein said second stage comprises a second transistor having an emitter coupled to said feedback resistor.

13. The electronic circuit of claim 12, wherein said second transistor is arranged in a cascode configuration to isolate said output from said transconductance stage.

14. The electronic circuit of claim 13, wherein said second transistor has a base supplied with bias voltage and a collector coupled to said output.

15. A narrow band RF electronic circuit, comprising:

an input for receiving an RF input signal, and an output;

a transconductance stage coupled to said input for transforming power of the input signal into current, said transconductance stage comprising a first bipolar transistor having a base coupled to said input, a collector and an emitter;

a second stage coupled between said transconductance stage and said output, said second stage comprising a second bipolar transistor having a base, a collector coupled to the output, and an emitter; and a frequency dependent shunt feedback circuit comprising (i) a feedback resistive device coupled between said collector of said first transistor and said emitter of said second transistor and (ii) a feedback capacitive device coupled between said base of said first transistor and said feed feedback resistive device, the frequency dependent shunt feedback circuit biasing the transconductance stage as a function of frequency of the input signal, to improve the noise figure of the electronic circuit; and a degeneration inductive impedance connected between said emitter of said first transistor and a ground terminal.

* * * * *